United States Patent
Chu et al.

(10) Patent No.: US 8,871,547 B2
(45) Date of Patent: *Oct. 28, 2014

(54) METHOD FOR FABRICATING VERTICAL LIGHT EMITTING DIODE (VLED) STRUCTURE USING A LASER PULSE TO REMOVE A CARRIER SUBSTRATE

(71) Applicant: SemiLEDS Optoelectronics Co., Ltd., Chu-Nan (TW)

(72) Inventors: Chen-Fu Chu, Hsinchu (TW); Wen-Huang Liu, Guan-Xi Town (TW); Jiunn-Yi Chu, Chubei (TW); Chao-Chen Cheng, Hsinchu (TW); Hao-Chun Cheng, Pingtung County (TW); Feng-Hsu Fan, Jhonghe (TW); Trung Tri Doan, Baoshan Township (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/176,292

(22) Filed: Feb. 10, 2014

(65) Prior Publication Data

US 2014/0154821 A1    Jun. 5, 2014

Related U.S. Application Data

(63) Continuation-in-part of application No. 11/761,897, filed on Jun. 12, 2007, now Pat. No. 8,685,764, and a continuation-in-part of application No. 11/032,882, filed on Jan. 11, 2005, now Pat. No. 7,432,119.

(51) Int. Cl.
  *H01L 21/20* (2006.01)
  *H01L 33/00* (2010.01)
  *H01L 33/10* (2010.01)

(52) U.S. Cl.
  CPC ........ *H01L 33/0066* (2013.01); *H01L 33/0075* (2013.01); *H01L 33/10* (2013.01); *H01L 33/0079* (2013.01)
  USPC ...................... 438/46; 438/605; 257/E33.001

(58) Field of Classification Search
  USPC ........................................ 438/22–47, 98, 605
  See application file for complete search history.

(56) References Cited

U.S. PATENT DOCUMENTS

| 6,071,795 A | 6/2000 | Cheung et al. |
| 6,172,382 B1 * | 1/2001 | Nagahama et al. ............. 257/94 |

(Continued)

OTHER PUBLICATIONS

PCT International Search Report and Written Opinion dated Dec. 23, 2009 for PCT Application No. PCT/US08/66378, pp. 1-10.

(Continued)

*Primary Examiner* — Savitr Mulpuri
(74) *Attorney, Agent, or Firm* — Stephen A. Gratton

(57) ABSTRACT

A method for fabricating a vertical light-emitting diode (VLED) structure includes the steps of providing a carrier substrate, and forming a semiconductor structure on the carrier substrate having a p-type confinement layer, a multiple quantum well (MQW) layer in electrical contact with the p-type confinement layer configured to emit electromagnetic radiation, and an n-type confinement layer in electrical contact with the multiple quantum well (MQW) layer. The method also includes the steps of removing the carrier substrate using a laser pulse to expose an inverted surface of the n-type confinement layer, and forming a metal contact on the surface of the n-type confinement layer.

17 Claims, 8 Drawing Sheets

(56) References Cited

U.S. PATENT DOCUMENTS

| | | | |
|---|---|---|---|
| 6,221,683 B1 | 4/2001 | Nirschi et al. | |
| 6,365,429 B1 | 4/2002 | Kneissl et al. | |
| 6,448,102 B1 | 9/2002 | Kneissl et al. | |
| 6,455,877 B1 * | 9/2002 | Ogawa et al. | 257/99 |
| 6,555,405 B2 | 4/2003 | Chen et al. | |
| 6,658,041 B2 | 12/2003 | Uebbing | |
| 6,744,071 B2 | 6/2004 | Sano et al. | |
| 6,746,889 B1 | 6/2004 | Eliashevich et al. | |
| 6,770,542 B2 | 8/2004 | Plossi et al. | |
| 6,800,500 B2 | 10/2004 | Coman et al. | |
| 7,432,119 B2 | 10/2008 | Doan | |
| 7,432,882 B2 | 10/2008 | Kosaka et al. | |
| 7,615,789 B2 | 11/2009 | Tran | |
| 8,507,302 B1 | 8/2013 | Chu et al. | |
| 8,685,764 B2 | 4/2014 | Chu et al. | |
| 2004/0135158 A1 | 7/2004 | Hon | |
| 2004/0166599 A1 | 8/2004 | Ishida | |
| 2004/0209402 A1 | 10/2004 | Chai et al. | |
| 2004/0245543 A1 | 12/2004 | Yoo | |
| 2005/0098792 A1 | 5/2005 | Lee et al. | |
| 2005/0196888 A1 | 9/2005 | Morita | |
| 2006/0099730 A1 | 5/2006 | Lee et al. | |
| 2006/0154390 A1 | 7/2006 | Tran et al. | |
| 2006/0154391 A1 | 7/2006 | Tran et al. | |
| 2006/0154392 A1 | 7/2006 | Tran et al. | |
| 2006/0154393 A1 | 7/2006 | Doan et al. | |
| 2006/0157721 A1 | 7/2006 | Tran et al. | |
| 2007/0121690 A1 * | 5/2007 | Fujii et al. | 372/43.01 |
| 2008/0035950 A1 | 2/2008 | Chu et al. | |

OTHER PUBLICATIONS

Non-Final Office Action from U.S. Appl. No. 11/761,897 dated Mar. 12, 2008, pp. 1-7.

Final Office Action from U.S. Appl. No. 11/761,897 dated Oct. 31, 2008, pp. 1-7.

Final Office Action from U.S. Appl. No. 11/761,897 dated Aug. 31, 2009, pp. 1-7.

Non-Final Office Action from U.S. Appl. No. 11/761,897 dated Feb. 18, 2009, pp. 1-7.

Notice of Allowance from U.S. Appl. No. 11/761,897 dated Nov. 12, 2013, pp. 1-7.

* cited by examiner

METHOD FOR FABRICATING VERTICAL LIGHT EMITTING DIODE (VLED) STRUCTURE USING A LASER PULSE TO REMOVE A CARRIER SUBSTRATE

CROSS-REFERENCE TO RELATED APPLICATIONS

This application is a continuation-in-part of Ser. No. 11/761,897, filed Jun. 12, 2007, U.S. Pat. No. 8,685,764, which is a continuation-in-part of Ser. No. 11/032,882, filed Jan. 11, 2005, U.S. Pat. No. 7,432,119.

FIELD

This application relates generally to vertical light emitting diode (VLED) structures and particularly to a method for fabricating a vertical light emitting diode (VLED) structure having a low resistance contact using a laser pulse to remove a carrier substrate.

BACKGROUND

Doped layers are often deposited during fabrication of various types of semiconductor devices. For example, during the fabrication of light emitting diodes (LED), p-doped layers such as p-GaN, and n-doped layers, such as n-GaN, can be deposited to form multi layered epitaxial structures configured to emit electromagnetic radiation. FIG. 1 illustrates a semiconductor structure 10 comprising an n-GaN layer 12 and a p-GaN layer 14 separated by a multi-quantum well MQW layer 16. The semiconductor structure 10 can be formed on a substrate 18 made of a suitable material, such as SiC, or sapphire.

The deposition process for forming the semiconductor structure 10 can include gaseous reactions, such as $3GaCl+3NH_3 \rightarrow 3GaN+2H_2+3HCl$ or $TMG+NH_3 \rightarrow GaN+CH_x+H_2$. Such deposition on a c-plane carrier substrate, typically results in the growth of a crystalline structure along the c-axis of the hexagonal crystal. An as deposited surface 20 (FIG. 2A) of the crystalline structure includes atomic bonds between Ga atoms 22 (FIG. 2A) and N atoms 24 (FIG. 2A). This crystalline structure is shown along the C-axis in FIG. 2A. The as deposited surface 20 (FIG. 2A) of the crystalline structure is usually very stable, as the atoms 22, 24 normally occupy the lowest free energy states during the deposition process.

As shown in FIG. 3, a p-pad contact 26 and an n-pad contact 28 can also be formed for applying a voltage differential across the n-GaN layer 12 and p-GaN layer 14 causing the multi-quantum well MQW layer 16 to emit electromagnetic radiation. In conventional LED fabrication processes, the n-pad contact 28 can be formed as a metal contact on the as-deposited surface 20 (FIG. 2A) of the n-GaN layer 12.

In some cases, semiconductor structures are formed using processes that result in crystal structures having an inverted configuration of atomic bonds between the Ga and N atoms along the c-axis of the crystal structure (in the direction towards the surface). The inverted configuration of atomic bonds can be formed by removing the substrate 18, thus exposing an inverted surface 30 (FIG. 2B). By way of example, this type of inverted surface 30 can be formed during fabrication of a VLED device, as described in U.S. Pat. No. 7,432,882, which is herein incorporated by reference.

The inverted surface 30 comprises a man-made surface, and the crystal structure of the surface 30 can be less stable than in an as deposited GaN surface 20 (FIG. 2A). As used herein stable refers to the uniformity of contact resistance when forming contacts. As a result of this, forming low resistance electrical contacts on an inverted GaN surface 30 is not well known in the art.

The present disclosure is directed to a method for fabricating a vertical light emitting diode (VLED) structure in which a carrier substrate is removed using a laser pulse to form an inverted surface. Low resistance contacts can then be formed on the inverted surface.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION OF THE PREFERRED EMBODIMENTS

It is to be understood that when an element is stated as being "on" another element, it can be directly on the other element or intervening elements can also be present. However, the term "directly" means there are no intervening elements. In addition, although the terms "first", "second" and "third" are used to describe various elements, these elements should not be limited by the term. Also, unless otherwise defined, all terms are intended to have the same meaning as commonly understood by one of ordinary skill in the art.

Referring to FIGS. 4A-4D, steps in a method for fabricating a vertical light emitting diode (VLED) structure 32 (FIG. 4D) are illustrated. For simplicity, various elements of the vertical light emitting diode (VLED) structure 32 (FIG. 4D) are not illustrated in all of the figures. However, this type of vertical light emitting diode (VLED) structure is further described in U.S. Pat. No. 7,615,789, which is incorporated herein by reference.

Figure 4A:
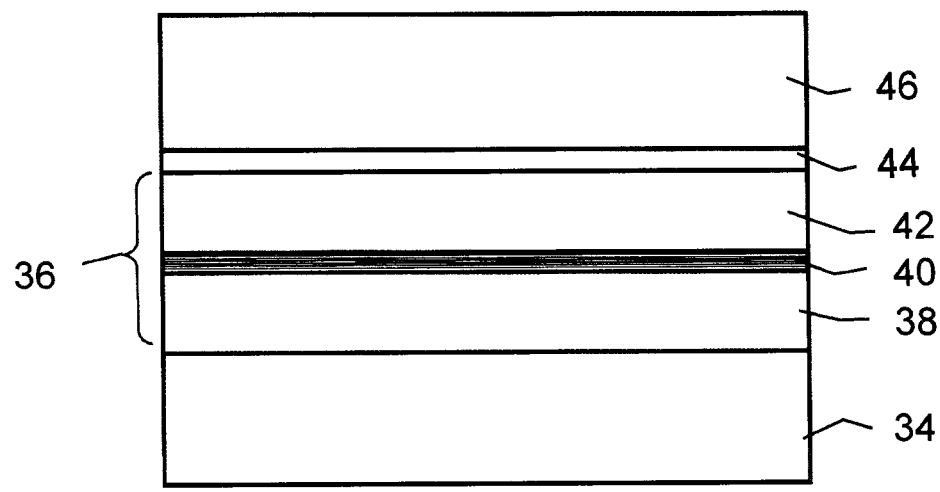
FIGS. 4A-4D are a schematic cross sectional views illustrating steps during fabrication of a VLED structure having an n-type confinement layer with an inverted surface.

Initially, as shown in FIG. 4A, a carrier substrate 34 can be provided. The carrier substrate 34 can be in the form of a wafer comprised of a suitable material, such as sapphire, silicon carbide (SiC), silicon, germanium, zinc oxide (ZnO), or gallium arsenide (GaAs).

As also shown in FIG. 4A, a semiconductor structure 36 comprising a multi-layer epitaxial stack can be formed on the carrier substrate 34. The semiconductor structure 36 can be formed using a suitable deposition process such as vapor phase epitaxy (VPE), molecular beam epitaxy (MBE) or liquid phase epitaxy (LPE). The semiconductor structure 36 includes an n-type confinement layer 38, a multiple quantum well (MQW) layer 40 on the n-type confinement layer 38 configured to emit electromagnetic radiation, and a p-type confinement layer 42 on the n-type confinement layer 38.

The n-type confinement layer 38 (FIG. 4A) preferably comprises n-GaN. Other suitable materials for the n-type confinement layer 38 include n-AlGaN, n-InGaN, n-AlInGaN, AlInN and n-AlN. The multiple quantum well (MQW) layer 40 preferably includes one or more quantum wells comprising one or more layers of InGaN/GaN, AlGaInN, AlGaN, AlInN and AlN. The multiple quantum well (MQW) layer 40 can be configured to emit electromagnetic radiation from the visible spectral region (e.g., 400-770 nm), the violet-indigo spectral region (e.g., 400-450 nm), the blue spectral region (e.g., 450-490 nm), the green spectral region (e.g., 490-560 nm), the yellow spectral region (e.g., 560-590 nm), the orange spectral region (e.g., 590-635 nm) or the red spectral region (e.g., 635-700 nm). The p-type confinement layer 42 preferably comprises p-GaN. Other suitable materials for the p-type confinement layer 42 include p-AlGaN, p-InGaN, p-AlInGaN, p-AlInN and p-AlN.

As also shown in FIG. 4A, a reflective layer 44 can be formed on the p-type confinement layer 42 and a thin protective layer (not shown), such as a layer of $SiO_2$ can be formed on the reflective layer 44. By way of example, the reflective layer 44 can comprise multiple layers, such as Ni/Ag/Ni/Au, Ag/Ni/Au, Ti/Ag/Ni/Au, Ag/Pt or Ag/Pd or Ag/Cr, formed by depositing an alloy containing Ag, Au, Cr, Pt, Pd, or Al. A thickness of the reflective layer 44 can be less than about 1.0 μm. High temperature annealing or alloying of the reflective layer 44 can be used to improve the contact resistance and adhesion of the reflective layer 44 to the p-type confinement layer 42. For example, the annealing or alloying process can be conducted at a temperature of at least 150° C. in an inert environment (e.g., an atmosphere containing little or no oxygen, hydrogen, or neither oxygen nor hydrogen).

As also shown in FIG. 4A, a conductive substrate 46 can be formed on the reflective layer 44. The conductive substrate 46 can comprise a single metal layer or a stack of two or more metal layers, formed using a suitable deposition process. In addition, the material for the conductive substrate 46 can be selected to provide a high electrical conductivity and a high thermal conductivity. Suitable materials for the conductive substrate 46 include W, Ti, Mo, Al, Cu, Ni, Ag, Au, Co, Cu—Co, Ni—Co, Cu—Mo, Ni/Cu, Ni/Cu—Mo and alloys of these metals. Suitable deposition processes for forming the conductive substrate 46 include electro-deposition, electroless-deposition, chemical vapor deposition (CVD), plasma enhanced chemical vapor deposition (PECVD), physical vapor deposition (PVD), evaporation, and plasma spray. Rather than being a metal, the first conductive substrate 46 can comprise a semiconductor material, such as Si, or another material, such $SiO_2$, GaAs, SiC, AlN, $Al_2O_3$, or sapphire.

Figure 4B:
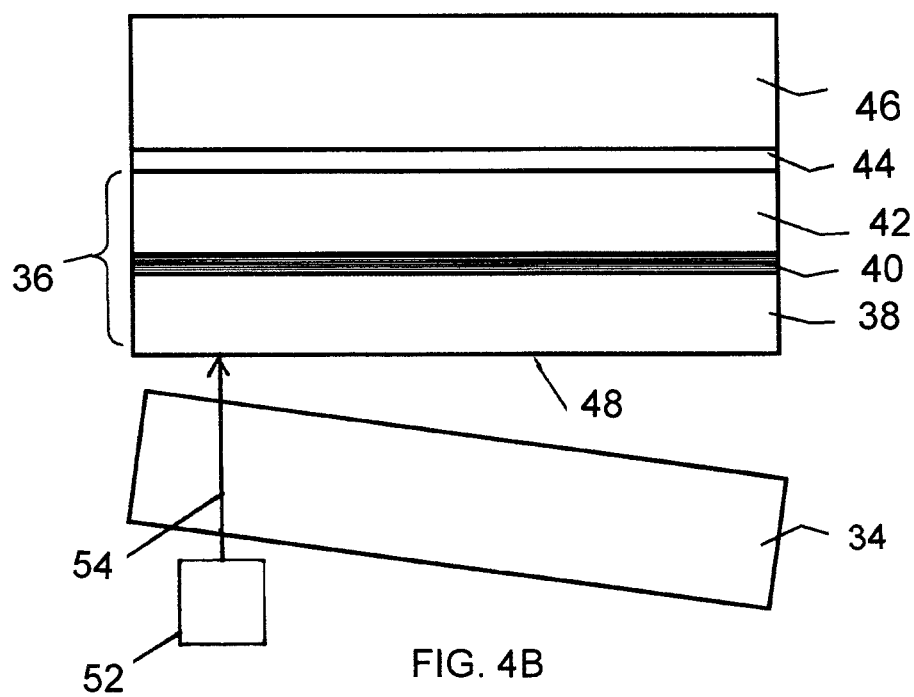

Next as shown in FIG. 4B, a substrate removing process can be performed to separate the carrier substrate 34 from the n-type confinement layer 38 and expose an inverted surface 48. The substrate removing process can be performed using a laser system 52 configured to generate a plurality of laser pulses 54. The laser system 52 can comprise a conventional laser system configured to focus the laser pulses 54 at the interface of the carrier substrate 34 and the n-type confinement layer 38. One suitable laser system 52 comprises a UV (266 nm) Q switching diode pump laser system. Another suitable laser system 52 comprises a UV excimer gas laser using ArF at 193 nm, KrF at 248 nm and F2 at 155 nm. The operational parameters of the laser system 52 can be selected so that the laser pulses 54 decompose the interfacial layers of the n-type confinement layer 38 with the carrier substrate 34, permitting removal of the carrier substrate 34. In addition, the laser pulses 54 can be larger than the size of the devices being fabricated, such that an overlap of two laser pulses 54 can occur such as in the middle of a street between devices. Although removal of the carrier substrate 34 using laser pulses 54 is preferred, other methods, such as chemical lift off (wet etching) or mechanical lift off (grinding, polishing, CMP), can alternately be employed.

Figure 1:
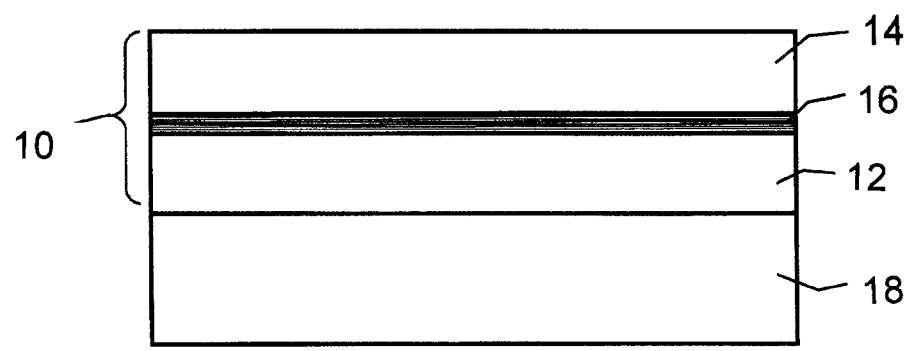
FIG. 1 is a schematic cross sectional view of a prior art semiconductor structure having a GaN layer.
Figure 2A:
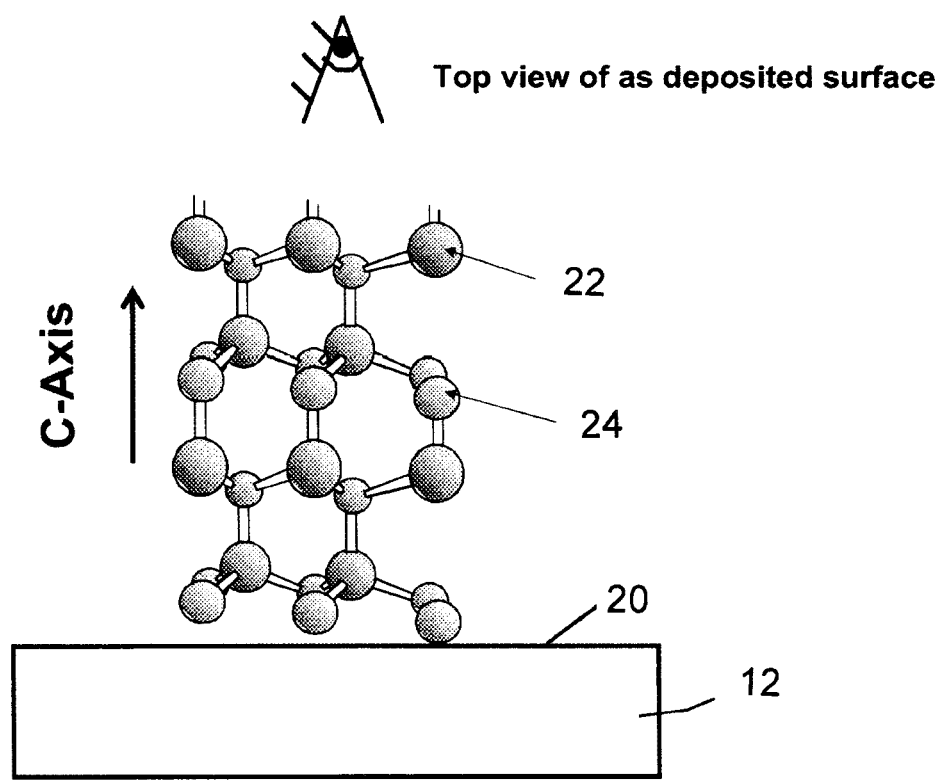
FIG. 2A is a schematic cross sectional view illustrating an exemplary crystalline structure of an as deposited GaN layer.
Figure 2B:
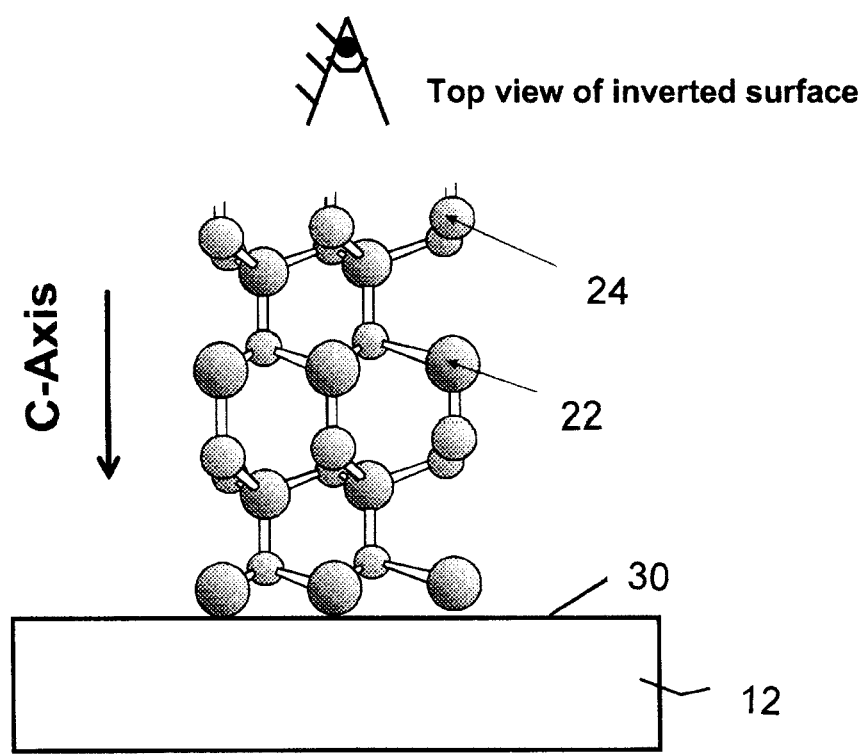
FIG. 2B is a schematic cross sectional view illustrating an exemplary crystalline structure of an exposed GaN layer having an inverted surface formed by removing a carrier substrate.
Figure 3:
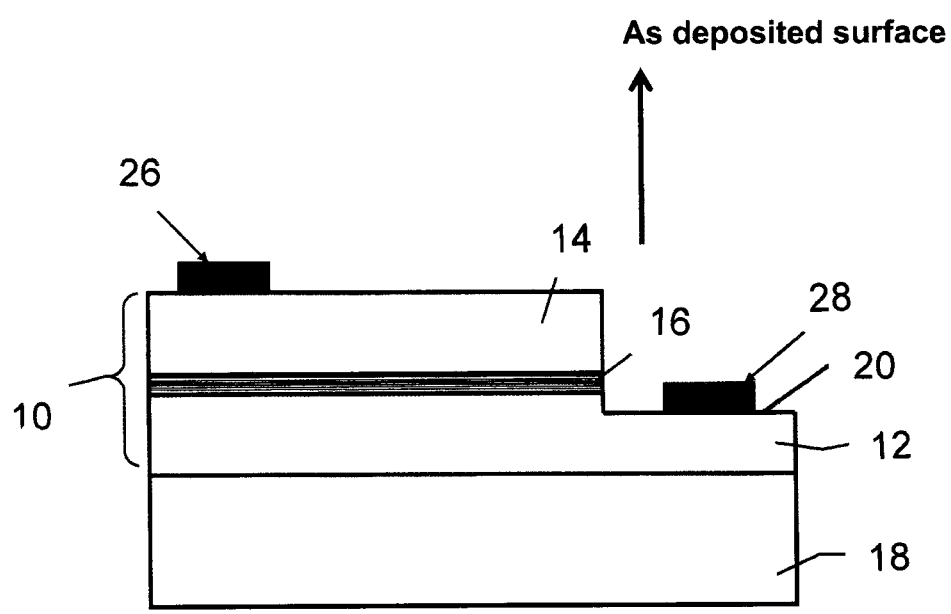
FIG. 3 is a schematic cross sectional view illustrating the semiconductor structure of FIG. 1 with contacts formed thereon.
Figure 4C:
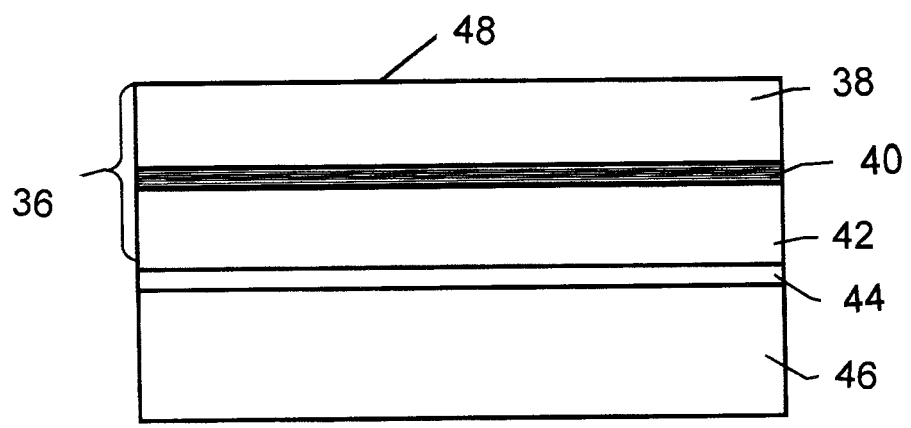

As shown in FIG. 4C, with the carrier substrate 34 removed, the semiconductor structure 36 can be flipped or rotated 180° so that the inverted surface 48 faces outward and upward. With the n-type confinement layer 38 comprising a nitrogen containing material, such as GaN, AlGaN, InGaN, AlInGaN, AlInN and AlN, this crystalline structure is sometimes referred to as being nitrogen-terminated, and the inverted surface is referred to a nitrogen-terminated surface. With the n-type confinement layer 38 comprising n-GaN, the inverted surface 48 has the crystalline structure shown in FIG. 2B. As previously explained, the atomic bonds between the N atoms 24 and the Ga atoms 22 have an inverted configuration compared to the crystalline structure shown in FIG. 2A. The inverted surface 48 also has different properties compared to the as-deposited GaN surface 30 shown in FIG. 2A.

Figure 4D:
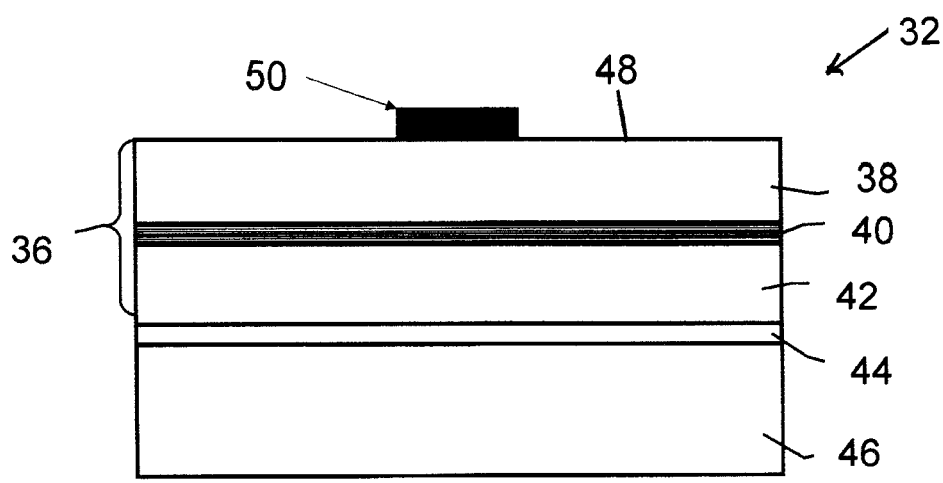

Next as shown in FIG. 4D, an n-contact 50 can be formed on the inverted surface 48 in electrical contact with the n-type confinement layer 38. The n-contact 50 can comprise a conductive material, such as a single layer of a metal or a metal stack. The n-contact 50 can be formed using a suitable deposition process, such as an electro-deposition process or an electroless deposition process, to a desired thickness (e.g., 1 μm to 500 μm) and with a desired geometry. Other suitable deposition processes for forming the n-contact 50 can include chemical vapor deposition (CVD), metal-organic chemical vapor deposition (MOCVD), plasma enhanced chemical vapor deposition (PECVD), molecular beam epitaxy (MBE), vapor phase epitaxy (VPE), physical vapor deposition (PVD), evaporation, and plasma spray.

The n-contact 50 can be formed as a stable, low resistance contact to lower the forward voltage ($V_F$) for obtaining high power efficiency, and better reliability in a VLED device. As used herein, the term "low resistance contact" generally refers to a contact having less than $5 \times 10^{-2}$ ohm-$cm^2$, preferably with less than $5 \times 10-5$ ohm-$cm^2$. As used herein, the term "stable" means a contact resistance having less than 10% variation during operation.

By way of example, the n-contact 50 can comprise an Al material such as Al/Ni/Au, AlTi/Ni/Au, Al/Pt/Au, Al/TaN/Au, AlTi/Pt/Au, AlTi/TaN/Au, AlSi/Ni/Au, AlSi/Pt,/Au, AlSiTaN/Au, AlCu/Ni/Au, AlCu/Pt/Au, and AlCu/TaN/Au. For some applications, the n-contact 50 can comprise a low work function metal, such as Sn, Zn, Mg, Hf, W, Ta, Co, Vd, Mo and their alloys can be used. Other suitable materials for the n-contact include Sn/Ni/Au, Sn/TaN/Au, Sn/Pt/Au, Zn/Ni/Au, Zn/TaN/Au, Zn/Pt/Au, Mg/Ni/Au, Mg/TaN/Au, Mg/Pt/Au, Hf/TaN/Au, Hf/Pt/Au, W/Au, W/Ni/Au, W/Pt/Au, Ta/Ni/Au, and Co/N/Au.

Thus the disclosure describes an improved vertical light emitting diode (VLED) structure and a method for fabricating the (VLED) structure. While the description has been with reference to certain preferred embodiments, as will be apparent to those skilled in the art, certain changes and modifications can be made without departing from the scope of the following claims.

What is claimed is:

1. A method for fabricating a vertical light-emitting diode (VLED) structure comprising:
   providing a carrier substrate;
   forming a semiconductor structure on the carrier substrate comprising a p-GaN confinement layer, a multiple quantum well (MQW) layer in electrical contact with the p-GaN confinement layer configured to emit electromagnetic radiation, and an n-GaN confinement layer in electrical contact with the multiple quantum well (MQW) layer;

forming a reflective layer on the p-GaN confinement layer;

forming a conductive substrate on the reflective layer;

removing the carrier substrate from the semiconductor structure on the reflective layer and the conductive substrate using a laser pulse to expose a nitrogen-terminated surface of the n-GaN confinement layer; and forming a metal contact on the nitrogen-terminated surface of the n-GaN confinement layer comprising a material selected from the group consisting of Al/Ni/Au, AlTi/Ni/Au, Al/Pt/Au, Al/TaN/Au, AlTi/Pt/Au, AlTi/TaN/Au, AlSi/Ni/Au, AlSi/Pt,/Au, AlSiTaN/Au, AlCu/Ni/Au, AlCu/Pt/Au, and AlCu/TaN/Au.

2. The method of claim 1 wherein the laser pulse is generated using a Q switching diode pump laser.

3. The method of claim 1 wherein the laser pulse is generated using a UV excimer laser.

4. A method for fabricating a vertical light-emitting diode (VLED) structure comprising:

providing a carrier substrate;

forming a semiconductor structure on the carrier substrate comprising a p-GaN confinement layer, a multiple quantum well (MQW) layer in electrical contact with the p-GaN confinement layer configured to emit electromagnetic radiation, and an n-GaN confinement layer in electrical contact with the multiple quantum well (MQW) layer;

removing the carrier substrate using a laser system having parameters selected to generate a plurality of laser pulses configured to decompose interfacial layers of the n-GaN confinement layer with the carrier substrate, and to expose a nitrogen-terminated surface of the n-GaN confinement layer; and forming an n-contact on the nitrogen-terminated surface of the n-GaN confinement layer, the n-contact comprising a material selected from the group consisting of Al/Ni/Au, AlTi/Ni/Au, Al/Pt/Au, Al/T aN/Au, AlTi/Pt/Au, AlTi/TaN/Au, AlSi/Ni/Au, AlSi/Pt,/Au, AlSiTaN/Au, AlCu/Ni/Au, AlCu/Pt/Au, and AlCu/TaN/Au.

5. The method of claim 4 wherein the forming the n-contact step is performed using an electro-deposition process or an electroless deposition process.

6. The method of claim 4 wherein the forming the n-contact step is performed using a process selected from the group consisting of chemical vapor deposition (CVD), metal-organic chemical vapor deposition (MOCVD), plasma enhanced chemical vapor deposition (PECVD), molecular beam epitaxy (MBE), vapor phase epitaxy (VPE), physical vapor deposition (PVD), evaporation, and plasma spray.

7. The method of claim 4 wherein the laser pulses have a width greater than a width of the semiconductor structure.

8. The method of claim 4 wherein the n-contact has a contact resistance less than $5 \times 10^{-2}$ ohm-cm$^2$.

9. The method of claim 4 wherein the laser system comprises a Q switching diode pump laser.

10. The method of claim 4 wherein the laser system comprises a UV excimer laser.

11. A method for fabricating a vertical light-emitting diode (VLED) structure comprising:

providing a carrier substrate;

forming a semiconductor structure on the carrier substrate comprising a p-GaN confinement layer, a multiple quantum well (MQW) layer in electrical contact with the p-GaN confinement layer configured to emit electromagnetic radiation, and an n-GaN confinement layer in electrical contact with the multiple quantum well (MQW) layer;

forming a reflective layer on the p-GaN confinement layer;

forming a conductive substrate on the reflective layer;

removing the carrier substrate using a laser system having parameters selected to generate a plurality of laser pulses configured to decompose interfacial layers of the n-GaN confinement layer with the carrier substrate, and to expose a nitrogen-terminated surface of the n-GaN confinement layer; and forming an n-contact on the nitrogen-terminated surface of the n-GaN confinement layer comprising a material selected from the group consisting of Al/Ni/Au, AlTi/Ni/Au, Al/Pt/Au, Al/TaN/Au, AlTi/Pt/Au, AlTi/TaN/Au, AlSi/Ni/Au, AlSi/Pt,/Au, AlSiTaN/Au, AlCu/Ni/Au, AlCu/Pt/Au, and AlCu/TaN/Au.

12. The method of claim 11 wherein the n-contact has a contact resistance less than $5 \times 10^{-2}$ ohm-cm$^2$.

13. The method of claim 11 wherein the laser system comprises a Q switching diode pump laser.

14. The method of claim 11 wherein the laser system comprises a UV excimer laser.

15. The method of claim 11 wherein the laser pulses have a width greater than a width of the semiconductor structure.

16. The method of claim 11 wherein the forming the n-contact step is performed using an electro-deposition process or an electroless deposition process.

17. The method of claim 11 wherein the forming the n-contact step is performed using a process selected from the group consisting of chemical vapor deposition (CVD), metal-organic chemical vapor deposition (MOCVD), plasma enhanced chemical vapor deposition (PECVD), molecular beam epitaxy (MBE), vapor phase epitaxy (VPE), physical vapor deposition (PVD), evaporation, and plasma spray.

* * * * *